US 6,622,203 B2

(12) United States Patent
Simmons et al.

(10) Patent No.: US 6,622,203 B2
(45) Date of Patent: Sep. 16, 2003

(54) EMBEDDED MEMORY ACCESS METHOD AND SYSTEM FOR APPLICATION SPECIFIC INTEGRATED CIRCUITS

(75) Inventors: Laura Elisabeth Simmons, Corvallis, OR (US); Chancellor Archie, Portland, OR (US)

(73) Assignee: Agilent Technologies, Inc., Palo Alto, CA (US)

( * ) Notice: Subject to any disclaimer, the term of this patent is extended or adjusted under 35 U.S.C. 154(b) by 59 days.

(21) Appl. No.: 09/867,957

(22) Filed: May 29, 2001

(65) Prior Publication Data

US 2002/0184452 A1 Dec. 5, 2002

(51) Int. Cl.[7] .............................................. G06F 12/00
(52) U.S. Cl. ................................... 711/105; 365/230.05
(58) Field of Search ................................. 711/105, 118, 711/141, 147, 168, 169; 365/230.05

(56) References Cited

U.S. PATENT DOCUMENTS

| 5,623,628 A | * | 4/1997 | Brayton et al. | ............. 711/141 |
| 5,696,935 A | * | 12/1997 | Grochowski et al. | .. 365/230.05 |
| 5,996,051 A | * | 11/1999 | Mergard | ..................... 711/147 |
| 6,049,856 A | * | 4/2000 | Bolyn | ........................ 711/168 |
| 6,055,615 A | * | 4/2000 | Okajima | ..................... 711/169 |
| 6,430,654 B1 | * | 8/2002 | Mehrotra et al. | ........... 711/118 |

* cited by examiner

Primary Examiner—Donald Sparks
Assistant Examiner—Nasser Moazzami

(57) ABSTRACT

An application specific integrated circuit (ASIC) architecture for memory access. A first functional block provides a first address, a first column address strobe signal, and a first read/write signal associated with a first memory access. A second functional block provides a second address, a second column address strobe signal, and a second read/write signal associated with a second memory access. The ASIC architecture includes an embedded memory interface that is coupled to the first functional block and the second functional block. The embedded memory interface provides the first functional block and the second functional block access to an embedded memory either at the same time (referred to herein as concurrent access or simultaneous access) or at different times (referred to herein as consecutive or nonconcurrent access). When predetermined conditions are met, the embedded memory interface provides the first functional block and the second functional block concurrent access to the embedded memory. When the predetermined conditions are not met, the embedded memory interface provides consecutive access to the embedded memory.

19 Claims, 7 Drawing Sheets

EMBEDDED MEMORY ACCESS METHOD AND SYSTEM FOR APPLICATION SPECIFIC INTEGRATED CIRCUITS

FIELD OF THE INVENTION

The present invention relates generally to application specific integrated circuits (ASICs), and more particularly, to an embedded memory access method and system for application specific integrated circuits (ASICs).

BACKGROUND OF THE INVENTION

In the past, memories were typically found only in discrete packages (e.g., a discrete DRAM). The discrete DRAM provides data, control and address ports for use by another integrated circuit (IC) to access the DRAM. In recent years with the proliferation of application specific integrated circuits (ASIC), there has been much interest in integrating the DRAM with the ASIC (referred to as an embedded DRAM architecture) into the same package in order to improve DRAM access rates. An embedded DRAM architecture provides faster access rates since package delays and board delays are no longer encountered.

FIG. 1 illustrates a system 1 that has functional blocks (e.g., block0 and block1) that require access to a discrete DRAM 6. The system 1 employs a prior art DRAM controller 7 for providing read and write access to the discrete DRAM 6. It is noted that a chip boundary 5 separates the discrete DRAM 6 and the controller 7. The DRAM controller 7 includes an arbiter 9 for receiving requests from the functional blocks and selectively granting access to the DRAM 6 to one of the functional blocks. A data and control steering unit 8 is provided for receiving sets of data, control and address signals from each of the functional blocks and a select signal from the arbiter 9. Based on these inputs, the data and control steering unit 8 generates or provides one of the sets of signals to the discrete DRAM 6. In this manner, the data and control steering unit 8 provides access to the discrete DRAM 6 to one of the functional blocks at any one time.

Unfortunately, this current architecture limits the width of the data bus accessing the discrete DRAM. Typically, the data bus to the discrete DRAM is 4 to 16 bits. In this example, the bus width is 8 bits. As can be appreciated, regardless of the width of the internal data bus, the DRAM bus causes a constriction of the bandwidth of the data flow.

In other words, there is a mismatch in the width of the data bus external to the ASIC and the width of the data bus internal to the ASIC. This mismatch causes the system to perform at a sub-optimal level from a bandwidth viewpoint.

In this situation, the DRAM controller typically receives a larger data word and employs multiple DRAM accesses to perform an operation. The DRAM controller requires some sort of data buffer to store the data while making the multiple accesses.

In the situation where an embedded DRAM that has a wide data bus is integrated with the ASIC, the DRAM controller is required to buffer internal data to be written to the DRAM since the internal data bus width is less than the DRAM data bus. Similarly, data read from the DRAM needs to be buffered and partitioned into smaller units and then provided to the functional blocks in the ASIC.

One approach is to re-design the internal ASIC data path in order to take advantage of the wide data bus. However, this approach would not only involve substantial cost and design effort, but also would limit the use of such an ASIC for embedded memory applications (i.e., a dedicated use for embedded memories). As can be appreciated, it would be desirable for there to be a mechanism that can take advantage of the wide data bus offered by an embedded DRAM architecture, and yet be flexible enough to support discrete DRAM applications.

Based on the foregoing, there remains a need for a memory access method and system for embedded memories that overcomes the disadvantages set forth previously.

SUMMARY OF THE INVENTION

According to one embodiment of the present invention, an application specific integrated circuit (ASIC) architecture for memory access is provided. A first functional block provides a first address, a first column address strobe signal, and a first read/write signal associated with a first memory access. A second functional block provides a second address, a second column address strobe signal, and a second read/write signal associated with a second memory access.

The ASIC architecture includes an embedded memory interface that is coupled to the first functional block and the second functional block. The embedded memory interface provides the first functional block and the second functional block access to an embedded memory either at the same time (referred to herein as concurrent access or simultaneous access) or at different times (referred to herein as consecutive or non-concurrent access). When predetermined conditions are met, the embedded memory interface provides the first functional block and the second functional block concurrent access to the embedded memory. When the predetermined conditions are not met, the embedded memory interface provides consecutive access to the embedded memory.

In one embodiment, the ASIC architecture also includes a discrete memory interface that is coupled to the first functional block and the second functional block. The discrete memory interface provides the first functional block and the second functional block access to a discrete memory at different times (also referred to herein as consecutive access or non-concurrent access). Preferably, the discrete memory interface and embedded memory interface are both specified by a register transfer language. During synthesis, either the discrete memory interface or the embedded memory interface is synthesized depending on whether the application has a discrete memory or an embedded memory.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE PREFERRED EMBODIMENT

An access method and system for embedded memories are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

ASIC Architecture 200

Figure 1:
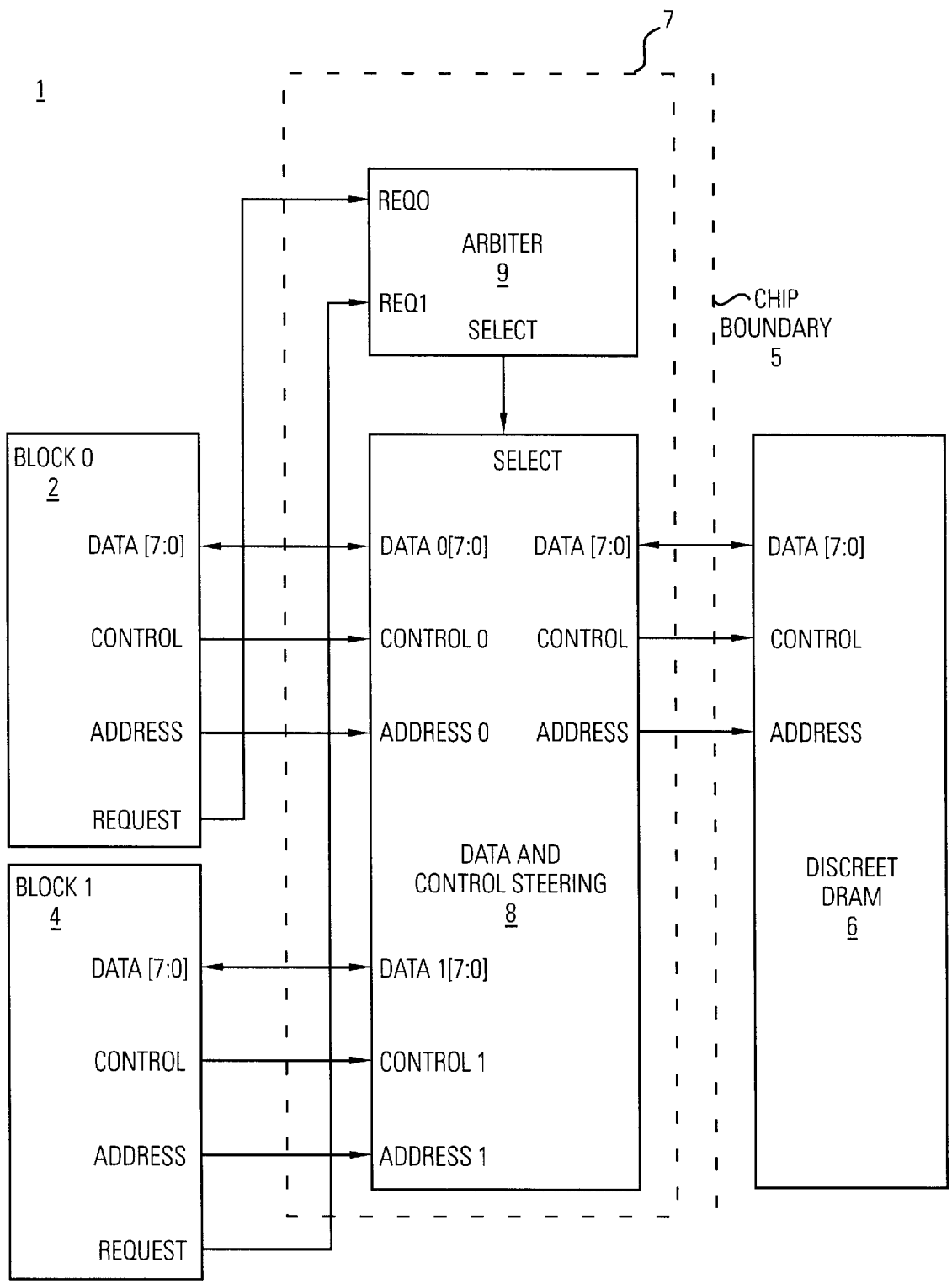
FIG. 1 illustrates a prior art DRAM controller.
Figure 2:
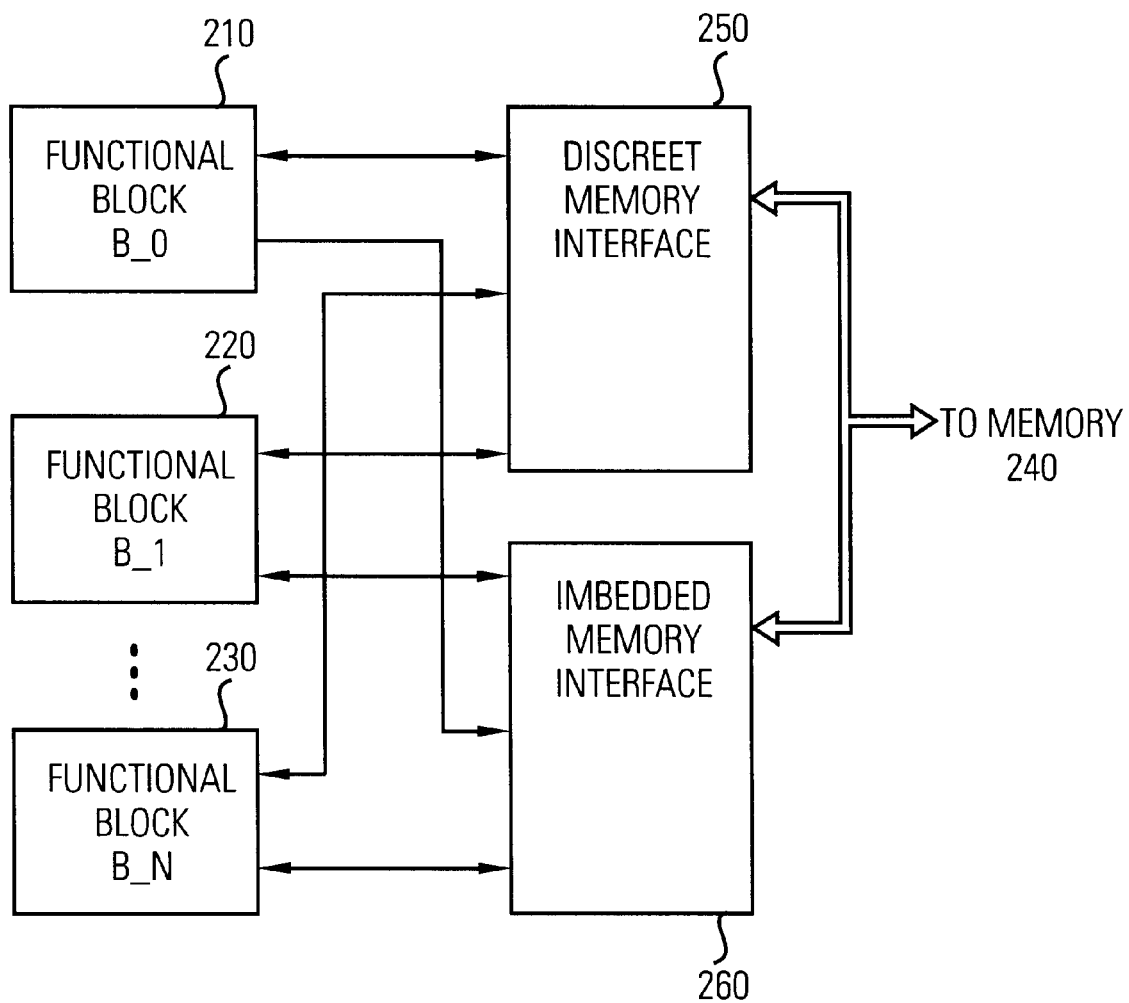
FIG. 2 illustrates an ASIC architecture according to one embodiment of the present invention.

FIG. 2 illustrates an ASIC architecture 200 according to one embodiment of the present invention. The ASIC architecture 200 includes a memory 240 that can, for example, be an embedded memory. As described in greater detail hereinafter, the memory 240 can be discrete memory when discrete memory interface (I/F) is implemented.

The ASIC architecture 200 includes a plurality of functional blocks, such as a first functional block (FB0) 210, a second functional block (FB2) 220, . . . , and a Nth functional block (FBN) 230 that require memory access. Each functional block may perform one or more functions. Examples of functional blocks can be, for example, but is not limited to, a direct memory access (DMA) functional block, a processor, a video processor, a cache controller, decompression blocks, and datapath blocks.

The ASIC architecture 200 can also includes an embedded memory 240 (e.g., an embedded dynamic random access memory (DRAM)). As described in greater detail hereinafter, the memory 240 can be a discrete memory when discrete memory interface (I/F) is implemented.

The ASIC architecture 200 can also includes a discrete memory I/F 250 for interfacing with a discrete memory and an embedded memory I/F 260 for interfacing with an embedded memory 240. The discrete memory I/F 250 is coupled to each functional block to receive memory access signals (e.g., control signals, address signals, and data signals) and based on these inputs, generates signals for controlling the discrete memory. The embedded memory I/F 260 is coupled to each functional block to receive memory access signals (e.g., control signals, address signals, and data signals) and based on these inputs, generates modified memory access signals for controlling the embedded memory. The operation of the embedded memory I/F 260 is described in greater detail hereinafter with reference to FIG. 3.

It is to be understood that during synthesis either the discrete memory I/F 250 or the embedded memory I/F 260 can be implemented depending on the application (i.e., whether the application has an embedded memory or utilizes a discrete memory).

Embedded Memory Interface 260

Figure 3:
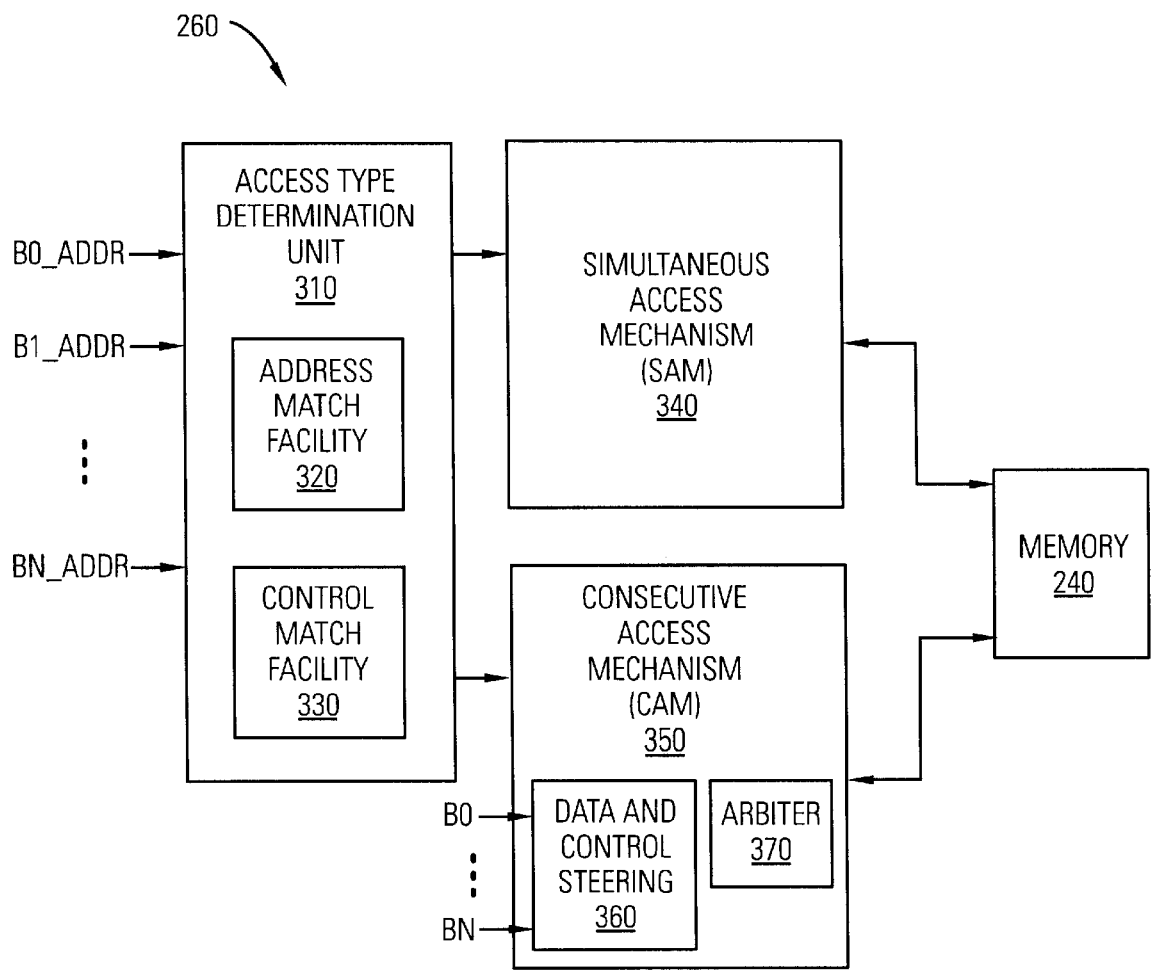
FIG. 3 illustrates in greater detail the embedded memory interface of FIG. 2 according to one embodiment of the present invention.

FIG. 3 illustrates in greater detail the embedded memory interface 260 of FIG. 2 according to one embodiment of the present invention. The embedded memory interface 260 includes an access type determination unit 310 for receiving signals from multiple functional blocks. In this embodiment, address signals (e.g., B0_addr, B1_addr, . . . , BN_addr) and control signals (e.g., B0_RW, B1_RW, . . . , BN_RW) are received.

The access type determination unit 310 includes an address match facility 320 for receiving the address from multiple functional blocks to determine whether the access is for the same memory location. The access type determination unit 310 includes a control signal match facility 320 for receiving the control signals (e.g., RW signals) from multiple functional blocks to determine whether control signal is the same. It is noted that the control match facility 330 may be omitted when the memory 240 is capable of simultaneous read and write of different columns in the same row.

When the access is for the same memory location and the specified memory operation is the same (i.e., either all write operations or read operations), a simultaneous access mechanism (SAM) 340 is employed for accessing the memory 240. When the access is not for the same memory location (i.e., at least one of the functional blocks require memory access of different memory locations) or the required operation is different (e.g., when one functional block requires a read access and the other functional blocks require write accesses), a consecutive access mechanism (CAM) 350 is employed for accessing the memory 240.

Simultaneous Access Mechanism (SAM) 340

Figure 4:
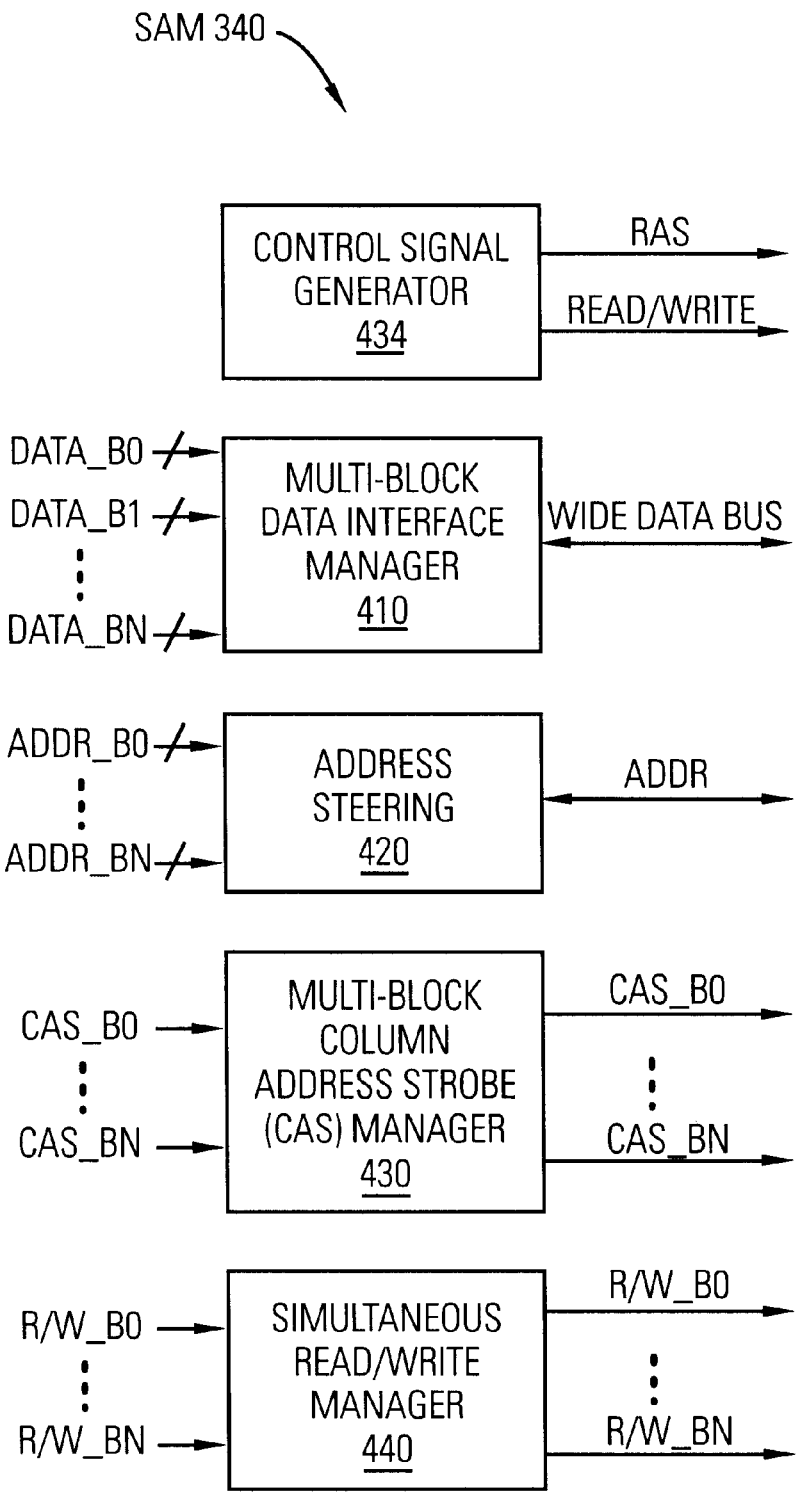
FIG. 4 illustrates in greater detail the simultaneous access mechanism (SAM) of FIG. 3 according to one embodiment of the present invention.

FIG. 4 illustrates in greater detail the simultaneous access mechanism (SAM) 340 of FIG. 3 according to one embodiment of the present invention. The simultaneous access mechanism (SAM) 340 includes a multi-block data I/F manager 410, an address steering facility 420, a multi-block column address strobe (CAS) manager 430, and optionally a simultaneous read and write manager 440.

The multi-block data I/F manager 410 receives data from at least two different functional blocks. In one example, the multi-block data I/F manager 410 receives eight bits of data from sixteen functional blocks. The multi-block data I/F manager 410 then combines or concatenates the data signals from the different functional blocks and generates a composite data signal having 128 data signals from the different functional blocks. This composite data signal is then asserted onto a wide data bus (e.g., 128 bits) that is coupled to the memory 240.

It is noted that by utilizing the SAM 340 sixteen blocks of data can be accessed in a single cycle. As can be appreciated the SAM 340 of the present invention provides substantial time savings since in the prior art, the same data would require multiple accesses (e.g., sixteen back-to-back cycles) where each cycle retrieve eight bits of data.

The address steering facility 420 receives the address for the memory access and provides the address on the address bus that is coupled to the memory 240.

The multi-block column address strobe (CAS) manager 430 receives column address strobe (CAS) signals from at least two different functional blocks. In one example, the multi-block CAS manager 430 receives a CAS signal from each functional block. The multi-block CAS manager 430 then provides one CAS signal (e.g., CAS_B0, CAS_B1, . . . , CAS_BN) for each functional block in order to allow each functional block to independently control access to a particular column in the memory 240. The use of a CAS signal from different functional blocks takes advantage of the increased width of the data bus and allows each functional block individual access to a column in the memory.

Alternatively, each functional block can control more than one CAS signal. For example, in an application having a first functional block that employs a 24-bit data bus, and other functional blocks that each feature an 8-bit data bus, the first functional block can control three of the CAS signals at once.

The simultaneous read and write manager 440 may be optionally provided when the memory 240 is especially configured to allow for concurrent read and write operations of different columns in a single row.

Further details concerning particular embodiments of a memory that allows for concurrent read and write operations of different columns in a single row may be found in the following copending patent application, entitled "MEMORY ARCHITECTURE FOR SUPPORTING CONCURRENT ACCESS OF DIFFERENT TYPES" by inventor Laura Elisabeth Simmons, which is filed concurrently herewith on May 29, 2001 and which is hereby incorporated herein by reference.

The simultaneous read and write manager 440 receives a read/write (R/W) control signal from each functional block and provides the control signal to the memory 240. In this manner, different columns in a same row can be accessed for different memory operations. For example, one column may be accessed by a first functional block for a read access, and another column in the same row may be accessed by a second functional block for a write access.

Figure 5:
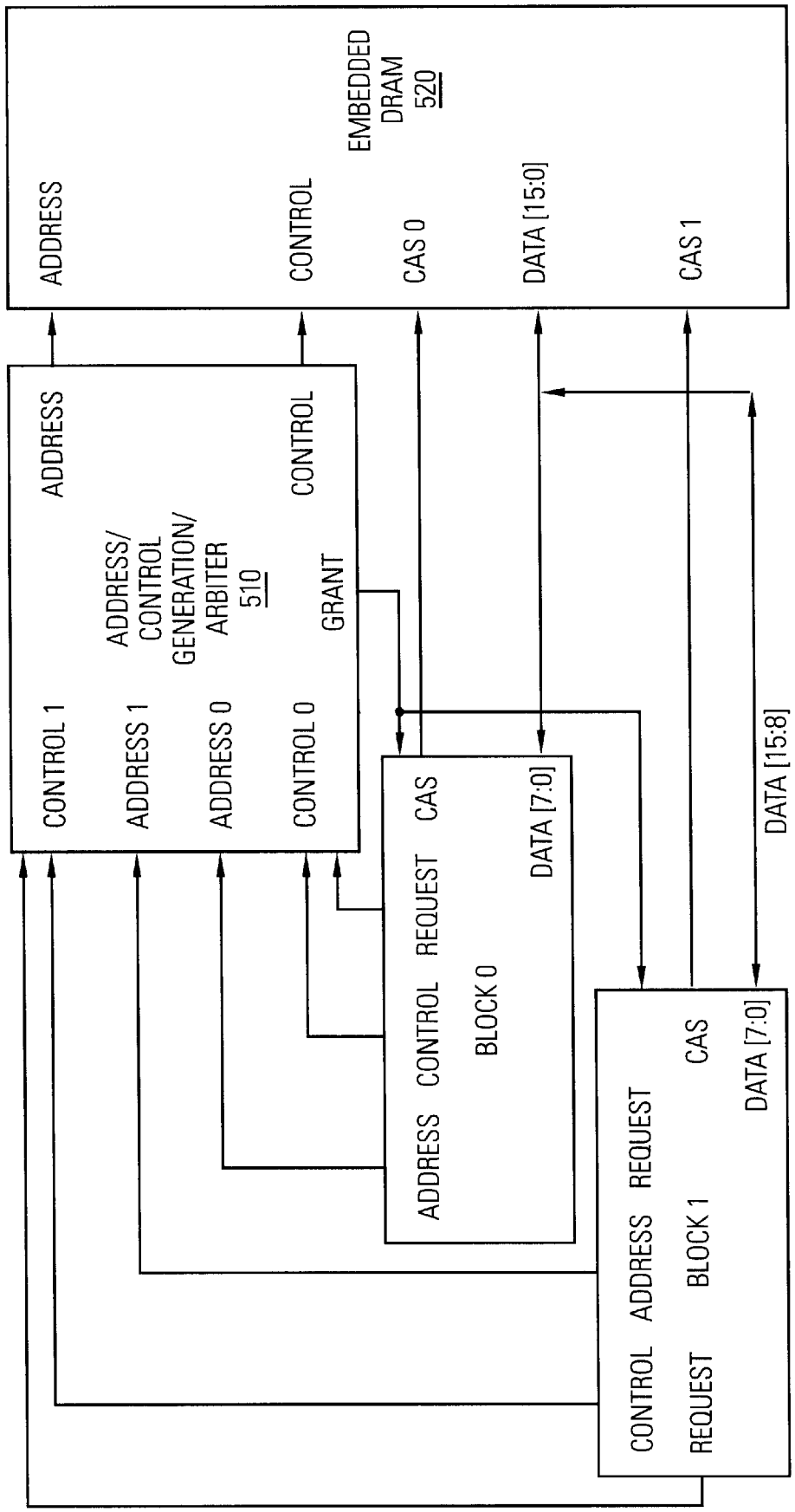
FIG. 5 illustrates in greater detail the embedded memory interface according to one embodiment of the present invention.

FIG. 5 illustrates in greater detail the embedded memory interface according to one embodiment of the present invention. In this embodiment, an address/control generation and arbitration facility 510 is provided for receiving control signals (e.g., read/write signals) from the functional blocks (e.g., block0 and block1) and generating a single address and single control signal.

The address/control generation and arbitration facility 510 determines whether the received addresses match and whether the control signals specify a common memory operation. When both of these conditions are met, the address/control generation and arbitration facility 510 asserts the common address and common control signal. Each functional block asserts its individual column address strobe (e.g., CAS0 and CAS1). Each functional block also receives a portion of the data bus (e.g., block0 receives data[7:0] and block1 receives data[15:8].

When either one of the above conditions is not met, consecutive or sequential access to the embedded memory is provided to the functional blocks. For example, the address/control generation and arbitration facility 510 arbitrates control of the memory 520 to the functional blocks at different times according to a predetermined arbitration scheme. In this embodiment, a request signal and corresponding grant signal may be provided for use by each functional block to request and receive access to memory 520 from address/control generation and arbitration facility 510.

The row address strobe signal can be provided by each functional block individually or can be generated by the address/control generation and arbitration facility 510.

Processing Flow

Figure 6:
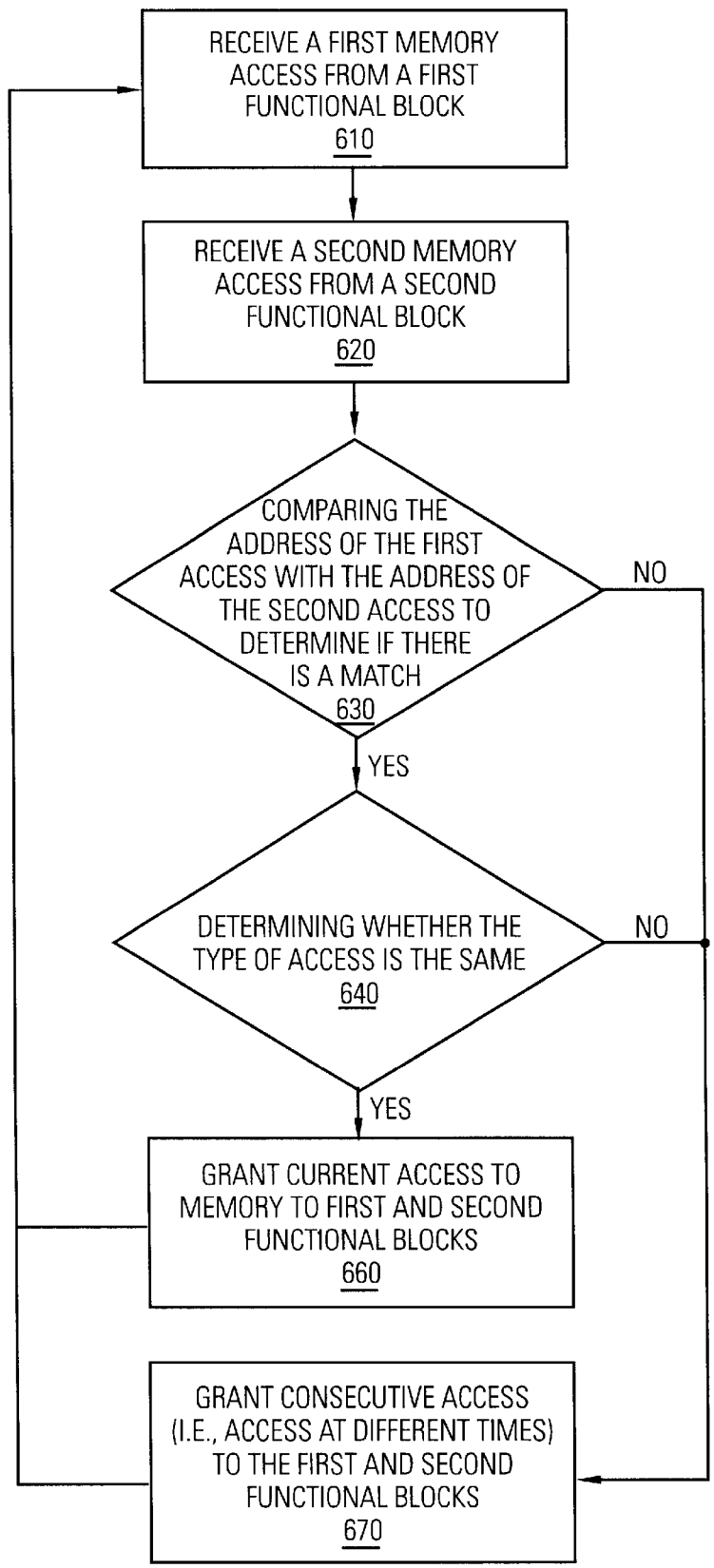
FIG. 6 is a flow chart illustrating the processing step performed by the embedded memory interface of FIG. 2 in accordance with one embodiment of the present invention.

FIG. 6 is a flow chart illustrating the processing step performed by the embedded memory interface of FIG. 2 in accordance with one embodiment of the present invention. In step 610, a first memory access request is received from a first functional block. The first memory access request can include a first address that specifies a location in memory for the access and control signals associated with the access (e.g., row address strobe signal, column address strobe signal, read/write signal). In step 620, a second memory access request is received from a second functional block. The second memory access request can include a second address that specifies a location in memory for the access and control signals associated with the access (e.g., row address strobe signal, column address strobe signal, read/write signal).

In step 630, the first address is compared with the second address to determine if the addresses match. When there is no match, in step 670, the embedded memory interface of the present invention allows each functional block to access the memory at different times (e.g., in a sequential or consecutive fashion). The consecutive access can be implemented by employing a predetermined arbitration scheme. The predetermined arbitration schemes are well known to those of ordinary skill in the art and can be, for example, a round robin scheme, a priority based arbitration scheme that is implemented by a state machine or a programmable hardware component.

When there is a match, in decision block 640, a determination is made whether the type of the first access request is the same as the type of the second access request (e.g., whether both accesses are read operations or both accesses are write operations). One manner to make this determination is to compare the read/write control signals of each access to determine if the signals are the same. This check is needed for those memories 240 that do not support simultaneous read and write operations to different columns in the same row. In other words, when the memory only supports either all read operations or all write operations for all columns in a row, this check ensures that the read and write control signals from the different functional blocks are consistent.

However, this decision block may be relaxed when the memory 240 supports simultaneous read and write operations to different columns in the same row.

When the type of the first access and the type of the second access are the same, then in step 660, simultaneous or concurrent access to the memory is granted to both the first functional block and the second functional block. For example, first functional block can access every byte in a first column (e.g., column0), and a second functional block can access every byte in a second column (e.g., column1), etc. In this regard, each functional block has data that occupies a tall row space, but the data does not span to other columns. Processing then continues at processing step 610. When the type of the first access and the type of the second access are not the same, then processing proceeds to step 670, where consecutive access to the memory is granted to the functional blocks. Thereafter, processing continues at processing step 610.

Exemplary Memory Configuration

Figure 7:
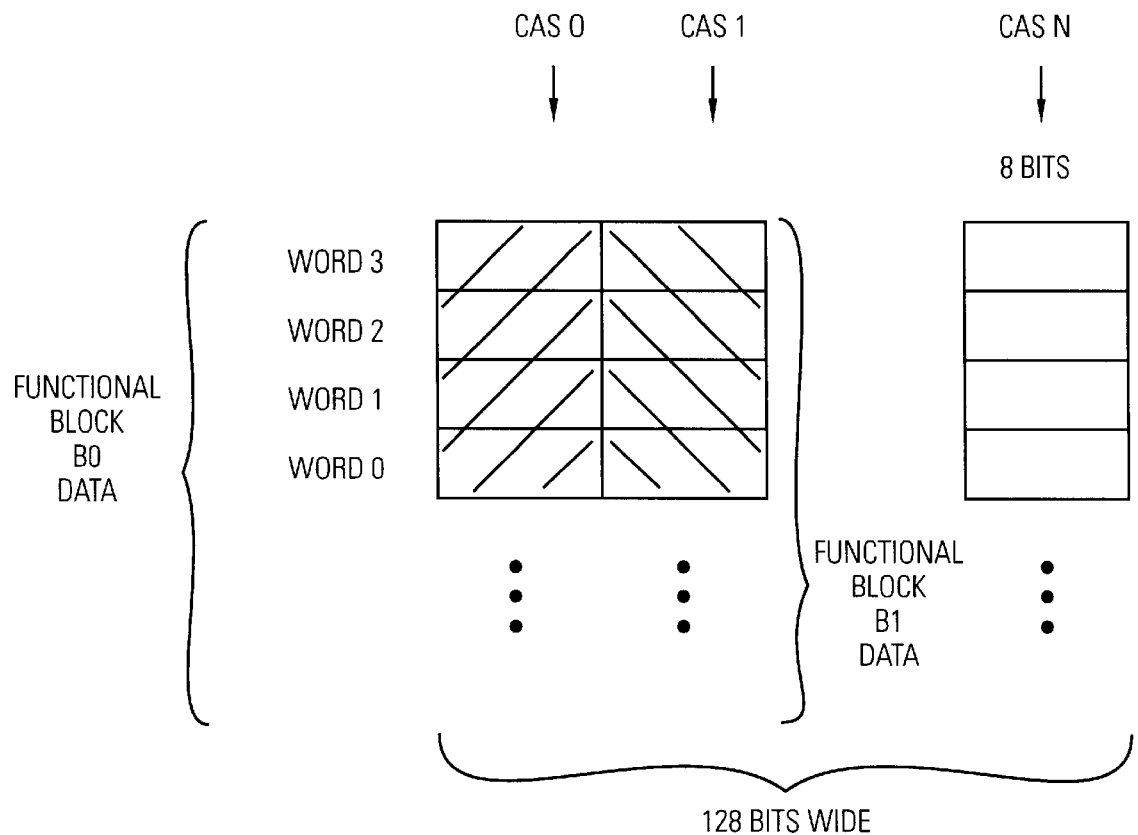
FIG. 7 illustrates an exemplary memory configuration that can be utilized by the embedded memory interface of the present invention.

FIG. 7 illustrates an exemplary memory configuration that can be utilized by the embedded memory interface of the present invention. It is noted that each functional block is allocated a memory space that includes a column of the memory. Each column is made individually accessible by utilizing an associated column address strobe (CAS) signal. In this example, each column can be eight bits wide, and there are sixteen functional blocks, resulting in a data bus that is 128 bits wide. Each functional block controls one or more of the CAS lines of the total N CAS signals (e.g., where N is equal to sixteen).

Referring to FIG. 2, the discrete memory I/F 250 and the embedded memory I/F 260 are designed into a memory control block in the ASIC (e.g., specified in the register transfer language (RTL)). Depending on the applications (e.g., embedded memory or discrete memory), during the synthesis step, either the discrete memory I/F 250 or the embedded memory I/F 260 is synthesized. In this manner, the ASIC design of the present invention provides a memory control architecture that can flexibly adapt to both discrete memory products and embedded memories. Consequently, the ASIC architecture provided by the present invention takes advantage of the wide data bus offered by an embedded memory without limiting the compatibility of the architecture to discrete memories or current/legacy ASIC architecture. The ASIC architecture of the present invention provides increased performance in terms of shorter memory access times, cost savings, and a decrease in the time to market since a discrete memory I/F and an embedded memory I/F are both incorporated into the design, and a re-design of the ASIC datapath is not required.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. An application specific integrated circuit comprising:
    a) a first functional block for providing a first address, a first column address strobe signal, and a first real write signal;
    b) a second functional block for providing a second address, a second column address strobe signal and a second read/write signal;
    c) an embedded memory for storing data; and
    d) an embedded memory interface coupled to the embedded memory, the first functional block and the second functional block for providing the first functional block and the second functional block access to the embedded memory at the same time when predetermined conditions are met and providing the first functional block and the second functional block access to the embedded memory at different times when the predetermined conditions are not met.

2. The circuit of claim 1 wherein the embedded memory interface includes
    an access type determination unit for determining a type of access;
    a simultaneous access mechanism coupled to the access type determination unit for handling simultaneous accesses to the memory; and
    a consecutive access mechanism coupled to the access type determination unit for handling consecutive accesses to the memory.

3. The circuit of claim 1 wherein the consecutive access mechanism includes
    an arbiter for arbitrating control of the memory between the first and second functional blocks; and
    a data and control steering facility coupled to the arbiter for selectively providing one of a first set of data and control signals from the first functional block and a second set of data and control signals from the second functional block.

4. The circuit of claim 3 wherein the arbiter implements one of a priority-based arbitration scheme and a round robin arbitration scheme.

5. The circuit of claim 1 wherein the simultaneous access mechanism includes
    a multi-block data interface managers for receiving data signals from the first and second functional blocks, concatenating the data signals into a composite data signal, and providing the data signals to a wide memory data bus; and
    a multi-block column address strobe manager for receiving column address strobe signals from the first and second functional blocks and providing the column address strobe signals to allow individual access of different columns in the memory.

6. The circuit of claim 5 wherein the simultaneous access mechanism further comprises
    an address steering facility for receiving the address from the first and second functional blocks and providing the address to the memory; and
    a read/write control signal steering facility for receiving first and second read/write control signals from the first and second functional blocks, respectively, and providing the first and second read/write control signals to the memory.

7. The circuit of claim 5 wherein the simultaneous access mechanism further comprises
    a common control signal generator for receiving a row address strobe signal and a read/write control signal and providing the row address strobe signal and a read/write control signal to the memory.

8. The circuit of claim 2 wherein the an access type determination unit for determining a type of access further comprises:
    an address match unit for receiving a first address from the first functional block and a second address from the second functional block, comparing the first and second addresses, and determining whether the addresses match, when the addresses do not match, the embedded memory interface employing the consecutive access mechanism to handle the memory access;
    a read/write control signal match unit for receiving a first read/write control signal from the first functional block and a second read/write control signal from the second functional block, comparing the first and second read/write control signal, and determining whether the read/write control signal are the same, when the read/write control signals are the same, the embedded memory interface employing the simultaneous access mechanism to handle the memory access.

9. The circuit of claim 1 further comprising:
    d) a discrete memory interface coupled to the first functional block and the second functional block for providing the first functional block and the second functional block access to a discrete memory at different times; and
    wherein the discrete memory interface and embedded memory interface are both specified by a register transfer language; and wherein one of the discrete memory interface and embedded memory interface is synthesized depending on whether the application has a discrete memory or an embedded memory.

10. The circuit of claim 1 wherein the embedded memory is an embedded dynamic random access memory (DRAM).

11. A method for providing to at least two functional blocks access to an embedded memory, the method comprising the steps of:
    a) receiving a first address and a first read/write signal from a first functional block;
    b) receiving a second address and a second read/write signal from a second functional block;
    c) comparing the first address with the second address and determining if there is a match;
    d) when there is no match, allowing the first functional block and the second functional block access to the memory at different times;
    e) when there is a match, determining if the first read/write signal and the second read/write signal specify a same memory operation;

f) when different memory operations are specified, allowing the first functional block and the second functional block access to the memory at different times; and g) when the same memory operation is specified, allowing the first functional block and the second functional block to access the memory at the same time.

12. The method of claim 11 further comprising:

a) receiving a first column address strobe from the first functional block;

b) receiving a second column address strobe from the second functional block; and c) using the first column address strobe and the second column address strobe to individually access different columns associated with the first functional block and the second functional block.

13. The method of claim 11 wherein the step of when there is no match, allowing the first functional block and the second functional block access to the memory at different times includes the step of employing a predetermined arbitration scheme to determine when the first functional block can have access to the memory and when the second functional block can have access to the memory.

14. The method of claim 11 wherein the embedded memory is an embedded dynamic random access memory (DRAM).

15. A method for providing to at least two functional blocks access to an embedded memory that supports concurrent read operation and write operation on different columns of the same row, the method comprising the steps of:

a) receiving a first address and a first read/write signal from a first functional block;

b) receiving a second address and a second read/write signal from a second functional block;

c) comparing the first address with the second address and determining if there is a match;

d) when there is no match, allowing the first functional block and the second functional block access to the memory at different times; and e) when there is a match, allowing the first functional block and the second functional block to access the memory at the same time.

16. An application specific integrated circuit comprising:

a) a first functional block for providing a first address, a first column address strobe signal, and a first signal;

b) a second functional block for providing a second address, a second column address strobe signal and a second read/write signal; and c) an embedded memory interface coupled to the first functional block and the second functional block for providing access to a location of an embedded memory specified by a first address to the first functional block and for providing access to a location of an embedded memory specified by a second address to the second functional block;

wherein the embedded memory interface allows the first functional block and the second functional block access to the embedded memory to access the embedded memory at the same time when the first address matches a second address and wherein the embedded memory interface allows the first functional block and the second functional block access to the embedded memory at different times when the first address does not match the second address.

17. The circuit of claim 16 further comprising:

d) a discrete memory interface coupled to the first functional block and the second functional block for providing the first functional block and the second functional block access to a discrete memory at different times; wherein the discrete memory interface and embedded memory interface are both specified by a register transfer language;

wherein one of the discrete memory interface and embedded memory interface is synthesized depending on whether the application has a discrete memory or an embedded memory.

18. The circuit of claim 16 wherein the embedded memory interface further comprises simultaneous read write manager for managing concurrent read access and write access of the embedded memory.

19. The circuit of claim 16 wherein the embedded memory is an embedded dynamic random access memory (DRAM).

* * * * *